(12) United States Patent
Tang

(10) Patent No.: US 8,896,899 B1
(45) Date of Patent: Nov. 25, 2014

(54) LASER MARKER

(71) Applicant: Zhen Tang, Plainsboro, NJ (US)

(72) Inventor: Zhen Tang, Plainsboro, NJ (US)

( * ) Notice: Subject to any disclaimer, the term of this patent is extended or adjusted under 35 U.S.C. 154(b) by 83 days.

(21) Appl. No.: 13/894,630

(22) Filed: May 15, 2013

(51) Int. Cl.
 G02B 26/08 (2006.01)
 G02B 27/20 (2006.01)

(52) U.S. Cl.
 CPC ............ G02B 26/0816 (2013.01); G02B 27/20 (2013.01)
 USPC ......... 359/221.3; 353/42; 353/43; 359/221.2; 362/259

(58) Field of Classification Search
 USPC ........ 359/212.2, 220.1, 221.2, 226.1; 353/42, 353/43; 235/462.45, 462.2, 462.21, 472.01
 See application file for complete search history.

(56) References Cited

U.S. PATENT DOCUMENTS

| | | | |
|---|---|---|---|
| 5,400,514 A | 3/1995 | Imbrie et al. | |
| 5,450,148 A | 9/1995 | Shu et al. | |
| 5,926,867 A | 7/1999 | Buchanan | |
| 6,000,813 A | 12/1999 | Krietzman | |
| 6,022,126 A | 2/2000 | Sekine et al. | |
| 6,789,922 B2 | 9/2004 | Lin | |
| 7,287,862 B2 | 10/2007 | Yavid | |
| 7,380,722 B2 | 6/2008 | Harley et al. | |
| 7,971,790 B2 | 7/2011 | Hung et al. | |
| 7,997,742 B2 | 8/2011 | Stern et al. | |
| 8,100,540 B2 | 1/2012 | Huebner | |
| 8,159,501 B2 | 4/2012 | Rao | |
| 2010/0165307 A1 | 7/2010 | Mizushima et al. | |

*Primary Examiner* — James Phan
(74) *Attorney, Agent, or Firm* — Kenneth Watov

(57) ABSTRACT

A laser marker/pointer for projecting circular or elliptical laser beam patterns onto a target surface such as a portion of a presentation screen or to assist in the aiming of a firearm, comprises a handheld shell body in which is mounted a laser light source, a rotating optical mirror driven by a motor, and an electronic drive circuit, whereby the aspect ratio of the marking pattern is determined by the geometric relationship of the motor shaft axis, the laser beam, and the mirror surface. The motor drive circuit when initially powered (along with the laser diode), applies full power (a continuous DC voltage to the motor to overcome inertia), followed by a pulsed voltage to lower the duty cycle of the motor, increase battery life, and reduce rotational noise.

14 Claims, 3 Drawing Sheets

LASER MARKER

FIELD OF THE INVENTION

The present invention is related generally to laser pointers, and more specifically to laser markers operable for projecting circular or elliptical illuminated patterns.

BACKGROUND OF THE INVENTION

In conference and meeting presentations, a presenter often uses a laser pointer to highlight portions of a projected viewgraph or slide presentation so that an associated oral message can be better understood by the audience. The conventional laser pointer projects only a small bright spot. The typically small sized spot can be difficult to distinguish when projected upon a large screen. Another disadvantage for a laser pointer often is the brightness of the spot, so that can make viewers very uncomfortable if their eyes focus on the spot.

An illuminated spot may also be used to assist in the aiming of a firearm to improve targeting accuracy during hunting. The small size of the mark can also be a disadvantage as it is difficult to be noticed far away.

A few modified laser pointers have been developed. For example, U.S. Pat. No. 5,450,148 uses a set of selectable masks to filter a magnified laser output into a desired pattern. U.S. Pat. No. 5,400,514 teaches a way to create light geometric tracing through moving a light source in one or two dimensions. None of above solutions provides a simple way to generate circular or elliptical patterns.

SUMMARY OF THE INVENTION

The primary object of this invention is to provide a laser pointer/marker that can generate a circular or elliptical pattern. The size of the pattern is proportional to the distance between laser pointer and illuminated target. A presenter can shine a large size circular or elliptical pattern on the projected screen display to highlight key messages more clearly to the audience. Similarly, a hunter can quickly identify the projected pattern on the target.

In the preferred embodiment of the present invention, an elliptical laser tracing pattern is achieved through reflection of a coherent laser light from a tilted rotating mirror positioned off the central axis of the laser beam. The device comprises three key parts, namely a laser diode, a rotating mirror, and an electronic circuit to drive the motor. A collimated light beam emitted from the laser diode impinges upon and is reflected from the face of a mirror. A small motor driven by an electronic circuit unit rotates the mirror. The mirror is tilted slightly from the perpendicular plane to the motor longitudinal axis of the shaft. The reflected light beam follows the rotational movement of the mirror and generates an elliptical shape that is projected onto the screen display. The electronic drive circuit initially provides full power to overcome the initial inertia and to start the motor. After a predetermined time, the electronic circuit reduces the duty cycle to conserve the battery energy, and lowers the rotational noise at the same time.

The relative spatial and angular arrangement of the longitudinal axis of the motor and the laser beam can alter the elliptical shape, or provide a circular shape.

BRIEF DESCRIPTION OF THE DRAWINGS

Various embodiments of the invention are described with reference to the drawings in which like items or components are identified by the same reference designation wherein.

DETAILED DESCRIPTION OF THE INVENTION

Figure 1:
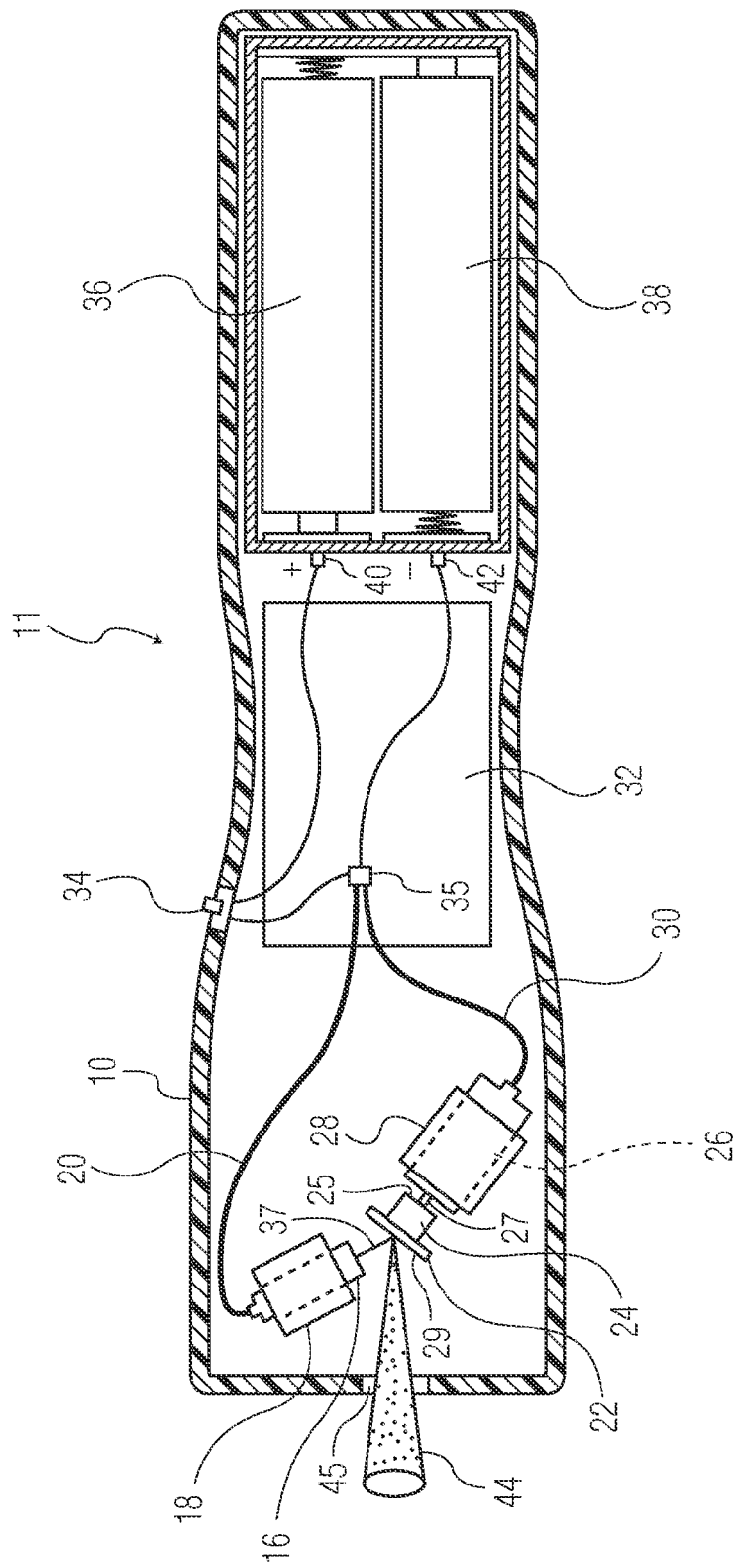
FIG. 1 is an illustration of a preferred embodiment of the laser pointer/marker of the present invention.

As shown in FIG. 1, the preferred embodiment of a device 11 according to the present invention for generating circular and elliptical laser patterns comprises a handheld housing or shell body 10, laser diode unit 16, mirror 22, electric motor 26, electric circuit board 32 to drive the motor 26, batteries 36 and 38, and a switch 34 operable for actuating device 11 by applying power from batteries 36, 38 to motor drive circuit 32 and laser diode unit 16.

Figure 4:
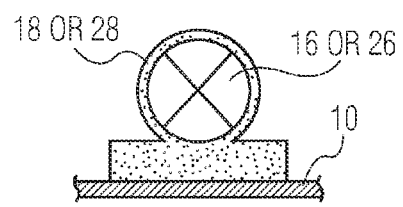
FIG. 4 illustrates a cut-away view for the mounting part for the electrical motor 26 or the laser diode 16 in FIG. 1.

The external shell body 10 houses the components of the device 11. The shell body 10 is typically cuboid shaped with rounded edges but can also use other more esthetically appealing curvy shapes. A laser diode beam generating unit 16 is powered by two batteries 36 and 38 controlled by an electric switch 34. The switch on the shell body 10 is positioned at a location for users to conveniently access. The diode laser unit 16 is attached to the shell body 10 by a mounting part 18, and motor 26 by a mounting part 28. A cut-away view of the mounting parts is shown in FIG. 4.

The positive terminal 40 from series connected batteries 36, 38 is individually connected to an arm of switch 34, and the negative terminal 42 to a generally shown electrical connection strip 35. The pole or output of switch 34 is connected to connection strip 35. The motor drive circuit 32 is connected via connection strip 35 to the pole of switch 34 and negative terminal 42. Also, the pole of switch 34, and negative terminal 42 are connected via a two conductor cable 20 to laser diode unit 16, via connection strip 35. Also, a two conductor cable 30 connects the motor drive circuit 32 via connection strip 35 to motor 26. Note that the use of connection strip 35 is not meant to be limiting in that other connection means can be used.

Operation of the present laser marker device 11 will now be described. The emitted diode laser beam 37 impinges on a mirror 22 and is reflected to generate the output beam 44. The output beam 44 passes through an optical window 45 at one end of the shell body 10 (see FIG. 1). The mirror 22 is affixed to a wedge shaped substrate 24. The substrate planar surface 25 facing the electrical motor 26 is perpendicular to the motor shaft 27, allowing the planar mirror face 29 to be slightly tilted. The detailed geometry of the mirror 22, laser diode 16, and motor 26 will be described in more detail below. The electric motor 26 rotates the tilted mirror 22 to generate the desired circular/elliptical patterns.

Figure 2:
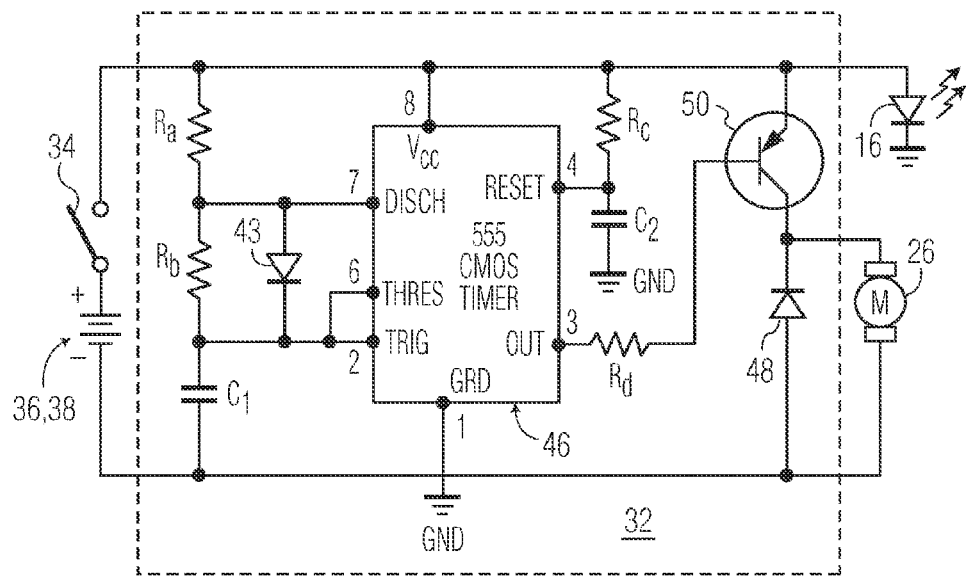
FIG. 2 is a schematic diagram of a representative embodiment of an electronic circuit for driving the mini motor.

FIG. 2 shows a representative circuit schematic diagram of the circuit board 32. The circuitry 32 uses a CMOS timer 46 (an LMT 555, for example) in the Astable Multivibrator mode to generate a pulsed output. The ratio of resistor value of $R_b$ to $R_a$ determines the duty cycle of the output pulse. One unique feature of the circuitry is the inclusion of a resistor $R_c$ and a capacitor $C_2$ to the reset pin 4 of the 555 CMOS timer 46. The resistor $R_c$ and capacitor $C_2$ enable the circuit to run the electric motor at 100% of duty cycle for a short fixed time (~$R_c \times C_2$) when the circuit is activated by closure of switch 34. This feature enables the motor 26 to draw a higher level of current to overcome the initial mechanical inertia. After the motor 26 starts and the capacitor $C_2$ is fully charged, the operation of the circuitry is changed to a pulse width modulator mode with a greatly reduced duty cycle to sustain the movement of the motor 26. The circuitry design of circuit board 32 offers the benefits of a lower motor rotational noise and the reduced power consumption. In the astable mode of operation, current flows from batteries 36, 38 through resistor $R_a$, and the low resistance path provided by forward biased diode 43 to charge capacitor $C_1$. When Capacitor $C_1$ is charged to a given level, it then discharges through resistor $R_b$, into discharge terminal 7 of the 555 CMOS timer 46. Diode 43 enables the astable mode duty cycle to be determined by the ratio of $R_b$ to $R_a$. Diode 48 suppresses electrical spikes generated by mini motor 26 as it rotates, thereby protecting the associated circuitry from damage. More specifically, the circuit components connected as shown in FIG. 2 includes switch 34 (momentary pushbutton SPST switch in this example); series connected batteries 36 and 38 (alternatively can be a single 3 VDC battery, for example); resistors $R_a$ (8.2KΩ), $R_b$ (1.2KΩ), $R_c$ (220KΩ), and $R_d$ (387Ω); capacitors $C_1$ (470 nF), and $C_2$ (1 µF); transistor 50 (a Darlington TIP125, for example); a micro motor 26 (Part No. F-K20, Voltage: 1V-7.5V, speed ~17,500 rpm at 3 volts/42,000 rpm at 7.5 volts); diodes 43 and 48 (each IN4004); and laser diode 16 [Part No. DRM506-D006; 650 nm 5 mW (Red) Laser Dot Module; a product of Optical Line Power]. Note that the laser diode 16 is provided in this example as a module that includes driver circuitry (not shown), and the laser diode 16. The component values and numbers are from an operable prototype of the present laser marker 11, and are not meant to be limiting.

Figure 3:
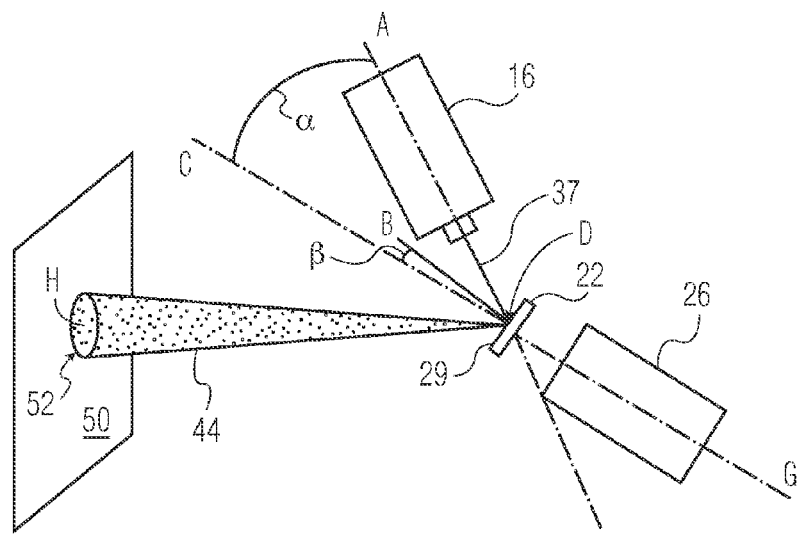
FIG. 3 is a diagram to describe the spatial and angular relationship of the mirror, the mini motor, and the laser beam.

FIG. 3 provides details of the geometric relationship among the laser diode 16, the electric motor 26, and the mirror 22. Line AD is the direction of laser beam 37 emitted from laser diode 16. Point D is the position where the laser beam 37 impinges on the mirror 22. Line BD is perpendicular to the surface of mirror 22. Line CDG is the central line or longitudinal axis of the shaft of electrical motor 26. The angle between laser beam 37 (also line AD) and motor shaft axis CDG is denoted by α. The angle between line BD and motor shaft axis CDG is denoted by β. For a projection screen 50 that is perpendicular to the center axis DH of the output circular/elliptical cone 52, the aspect ratio $L_r$ of the laser trace pattern 44 projected from mirror 22 can be estimated by the following equation:

$$L_r = \frac{\tan(2\beta)}{\tan\left(\cos^{-1}\left(\frac{1}{\sqrt{1+4(\cos^2\alpha)(\tan^2\beta)}}\right)\right)} \quad (1)$$

Obviously, for a screen 50 that is not perpendicular to the cone axis, the aspect ratio of the laser trace pattern is changed by the screen surface angle to the cone axis DH.

Figure 5:
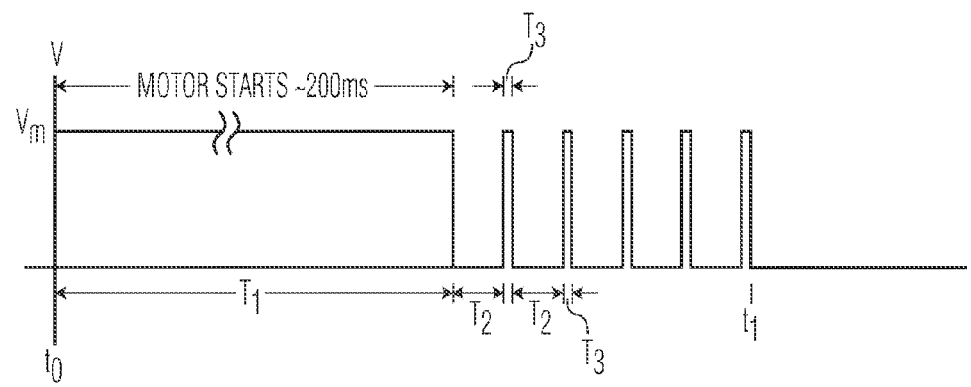
FIG. 5 is a waveform diagram showing the application of voltage to drive the motor from turn-on to a reduction in duty cycle over the time period of operation for one embodiment of the invention.

FIG. 5 is a waveform diagram showing that upon closure of switch 34 at time $t_0$, thereafter, during an initial time period $T_1$ (200 ms, for example) full power or voltage of VDC level is applied to motor 26. After capacitor C2 charges, the CMOS timer 46 enters into an astable mode of operation for applying a pulsed voltage to motor 26 of zero volts during time periods $T_2$ (2.7 ms, for example), and $V_{DC}$ during time period $T_3$ (0.3 ms, for example). When switch 34 is opened, capacitor C2 discharges through timer 46 to ground, and the drive voltage to motor 26 is terminated at time $t_1$.

Although various embodiments of the invention have been shown and described, they are not meant to be limiting. Those of skill in the art may recognize various modifications of these embodiments, which modifications are meant to be covered by the spirit and scope of the appended claims.

What is claimed is:

1. A laser beam marker for projecting a circular or elliptical pattern onto a receiving surface comprising:
   a housing having a frontmost optical window;
   a laser beam generating device mounted in said housing;
   a mirror having a reflective front face, and a back face;
   an electric motor mounted in said housing, said motor including a rotatable shaft;
   said mirror having its back face attached to an end of said motor shaft, the front face of said mirror being receptive of a laser beam outputted from said laser beam generating device, whereby the angle of incidence between the first face of said mirror and the laser beam determines an elliptical or circular pattern of said laser beam reflected from said mirror through said optical window of said housing upon rotation of said mirror;
   a DC source of voltage mounted in said housing;
   a motor drive circuit mounted in said housing;
   a switch mounted in said housing, said switch being electrically connected between said voltage source, and said motor and laser beam generating device, said switch being selectively operable for simultaneously connecting said voltage source thereto, or disconnecting it therefrom; and
   said motor drive circuit being responsive to the operation of said switch to connect said voltage source thereto, for initially applying a constant level of DC voltage to said motor to overcome inertia for rotating said motor shaft for a first period of time followed by applying a pulsed DC voltage to said motor for a second period of time to reduce the duty cycle of said motor, until operation of said switch to turn off said device by disconnecting said voltage source from said motor and laser beam generating device.

2. The device of claim 1, wherein said motor drive circuit includes a multivibrator configured upon turn-on to output a step voltage for the first period of time, followed by a pulse train for the second period of time.

3. The device of claim 2, wherein said multivibrator includes a CMOS timer.

4. The device of claim 2, wherein said motor drive circuit further includes:
   a CMOS timer having $V_{cc}$, discharge, threshold trigger, output, ground, and reset terminals, said $V_{cc}$ terminal being connected to said switch, said ground terminal being connected to ground;
   a first resistor connected between said switch and said reset terminal;
   a first capacitor connected between said reset terminal and ground;
   a second resistor connected between the pole of said switch, and said discharge terminal;
   a third resistor having one end connected to said discharge terminal, and another end connected in common to said threshold and trigger terminals; and
   a second capacitor connected between the another end of said third resistor and ground;

wherein the product of said first resistor and first capacitor determines said first period of time, and the ratio of said third resistor to said second resistor determines the duty cycle of said pulse train.

5. The device of claim 4, wherein said device further includes:
said motor having a first power terminal connected to ground, and a second power terminal;
said motor drive circuit further including:
a fourth resistor having one end connected to the output terminal off said CMOS timer, and another end;
a transistor having a base electrode connected to another end of said fourth resistor, and a main circuit path connected between said switch and the second power terminal of said motor;
whereby upon closure of said switch, a step voltage is outputted from said output terminal for turning on said transistor during said first period of time to apply said voltage source to said motor, whereafter during said second period of time the pulse train is outputted from said output terminal for periodically turning said transistor on and off for establishing a predetermined duty cycle for said motor.

6. The device of claim 5, wherein said transistor is a Darlington transistor.

7. The device of claim 1, wherein said laser beam generating device is connected between said switch and ground.

8. The device of claim 7, wherein said laser beam generating device is a laser diode having an anode connected to said switch, and a cathode connected to ground.

9. The device of claim 5, wherein said laser beam generating device is connected between said switch and ground.

10. The device of claim 9, wherein said laser beam generating device is a laser diode having an anode connected to said switch, and a cathode connected to ground.

11. The device of claim 5, wherein said motor drive circuit further includes:
a first diode having an anode electrode connected to the discharge terminal, and a cathode electrode connected to the common connection between said threshold and trigger terminals of said CMOS timer.

12. The device of claim 11, wherein said motor drive circuit further includes:
a second diode having an anode electrode connected to the ground, and a cathode electrode connected to the common connection between the second power terminal of said motor and main current path of said transistor.

13. The device of claim 1, wherein the aspect ratio $L_r$ of the projected laser beam pattern is determined from the following formula:

$$L_r = \frac{\tan(2\beta)}{\tan\left(\cos^{-1}\left(\frac{1}{\sqrt{1+4(\cos^2\alpha)(\tan^2\beta)}}\right)\right)} \quad (1)$$

wherein δ is the angle between the shaft or longitudinal axis of said motor and the laser beam as projected from said laser beam generating device, and β in the tilt angle between the front face of said mirror and the longitudinal axis of said motor.

14. The device of claim 1, wherein the DC source of voltage consists of at least one battery.

* * * * *